United States Patent [19]

Tanaka et al.

[11] 4,316,265

[45] Feb. 16, 1982

[54] MEMORY DEVICE WITH HIGH SPEED MEMORY CELL SELECTION MECHANISM

[75] Inventors: Hirotoshi Tanaka; Yoshiki Kawajiri, both of Hachioji; Kouetsu Chiba; Ryoichi Hori, both of Hinodemachi; Kiyoo Itoh, Higashikurume, all of Japan

[73] Assignee: Hitachi, Ltd., Tokyo, Japan

[21] Appl. No.: 94,927

[22] Filed: Nov. 16, 1979

[30] Foreign Application Priority Data

Nov. 20, 1978 [JP] Japan .................. 53/158800[U]

[51] Int. Cl.$^3$ ............................................. G11C 11/40
[52] U.S. Cl. ............................... 365/203; 365/174
[58] Field of Search ............... 365/203, 174, 189, 182

[56] References Cited

U.S. PATENT DOCUMENTS 4,112,508 9/1978 Itoh .................................. 365/203
4,208,730 6/1980 Dingwell et al. .................. 365/203

*Primary Examiner*—Terrell W. Fears
*Attorney, Agent, or Firm*—Craig and Antonelli

[57] ABSTRACT

In a memory device, row and column decoders are connected through a common address signal line to an address buffer, and the row decoder is connected through a switch to the common address signal line. When the address buffer delivers a first address signal, the switch is turned on so that the first address signal is applied to both of the column and row decoders. The column decoder includes therein provision for disabling the column decoder when the first address signal is applied to column decoder. The column decoder therefore does not respond to the first address signal. Subsequently, when the address buffer delivers a second address signal, the switch is turned off so that the row decoder is not applied with the second address signal but the column decoder responds to the second address signal. Thus, the row and column address respond to the first and second address signals respectively.

27 Claims, 3 Drawing Figures

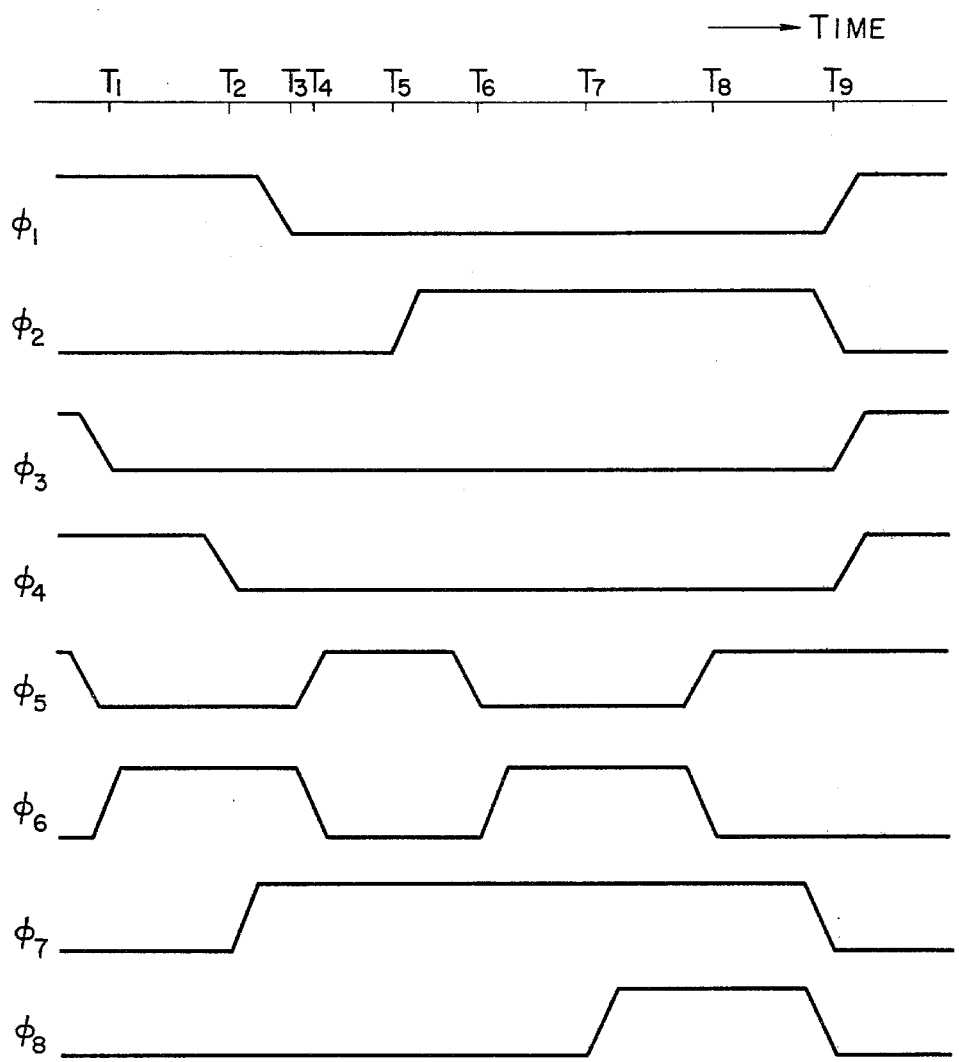

MEMORY DEVICE WITH HIGH SPEED MEMORY CELL SELECTION MECHANISM

BACKGROUND OF THE INVENTION

The present invention relates to a memory device having an improved arrangement of memory cells and including an improved decoder circuit, and more particularly to such a memory device employing n-type MOS transistors (MOSTs).

A conventional semiconductor memory employing n-type MOSTs, as described in "Digest of 1977 IEEE International Solid-State Circuit Conference", p.p. 12-13 includes two divided memory arrays, a column decoder arranged therebetween, and a row decoder for each memory array. First and second internal address signals from a common address buffer are time-sequentially supplied to the row and column decoders. The column decoder is coupled to the address buffer through a signal cutting MOST which is turned off and on respectively when the first and second internal address signals are applied to the column decoder. When a first external address signal is supplied to the address buffer, the first internal address signal corresponding to the first external address signal enables the row decoders. At this time, the above-mentioned signal cutting MOST is placed in the off-state, and therefore the first internal address signal is not applied to the column decoder. When the address buffer is subsequently applied with a second external address signal, the second internal address signal is delivered from the address buffer. At this time, the signal cutting MOST is placed in the on-state, and therefore the row and column decoders are enabled by the second internal address signal. In order to store the information or content of the first address signal in the row decoders, other signal cutting MOSTs are provided at the output sides of the row decoders, and these signal cutting MOSTs are turned off after each row decoder has been enabled by the first internal address signal. Thus, the row decoders deliver the first address signal information, and the column decoder delivers the second address signal information.

The conventional memory device having such construction, however, is not preferable from the standpoint of high speed operation, since the row and column decoders are both enabled by the second internal address signal, thereby increasing the load capacitance of the address buffer.

Further, in the case where, as described in U.S. Pat. No. 4,044,340, row lines are made of polysilicon and are finely patterned for selection of a large number of memory cells, the resistance of each row line is high. In order to reduce the propagation time of signal along the row line, it is desirable to increase the number of memory arrays. However, with the increased number of memory arrays row decoders must be provided at a correspondingly large number of locations. If the techniques described in the aforementioned reference are used intactly, a new wiring is required for applying the output signal of an address buffer to such a large number of row decoders, which lowers the integration degree in the memory device.

SUMMARY OF THE INVENTION

An object of the present invention is to solve the above-mentioned problems of the conventional memory device and to provide a memory device which can perform high speed operation.

Another object of the present invention is to provide a memory device which can be fabricated with high integration degree.

To that end, in a memory device according to the present invention, a row decoder and a column decoder are connected to an address buffer through a common address signal line, and the row decoder is connected to the common address signal line through switching means. When the address buffer delivers a first address signal, the switching means is turned on so that the first address signal is applied to both of the row and column decoders. The column decoder includes therein means for disabling the column decoder when the first address signal is applied to the column decoder. The column decoder does not respond to the first address signal. Subsequently, when a second address signal is delivered from the address buffer, the switching means is turned off so that the second address signal is not applied to the row decoder but is applied only to the column decoder. Thus, the row and column decoders respond to the first and second address signals respectively.

BRIEF DESCRIPTION OF THE DRAWINGS

FIG. 3 is a time chart of control signals used in the circuit shown in FIG. 2.

DESCRIPTION OF THE PREFERRED EMBODIMENTS

Figure 1:
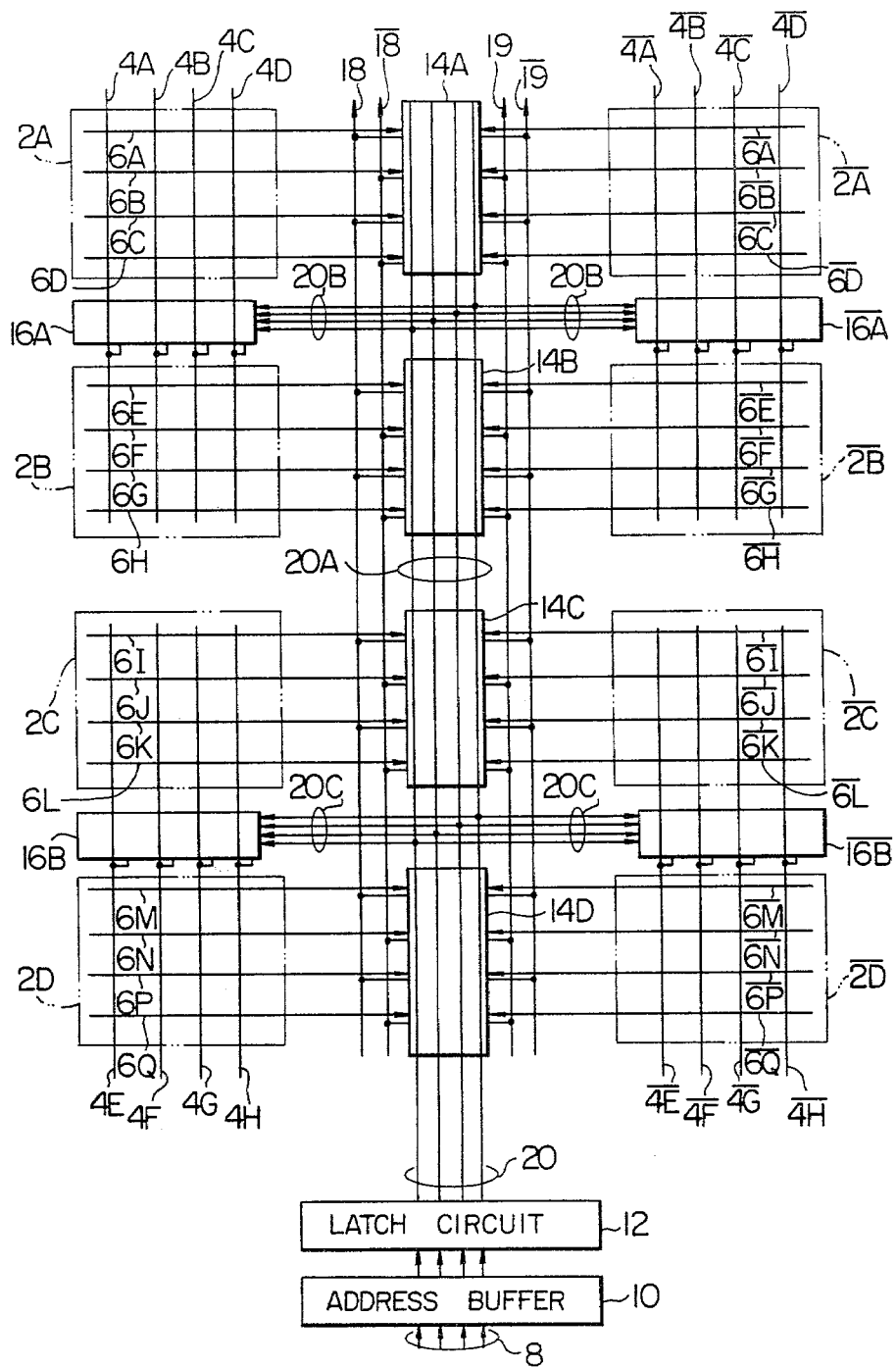
FIG. 1 is a schematic diagram of an embodiment of a memory device of the present invention also showing a layout thereof viewed from above.

Now, an embodiment of a memory device according to the present invention will be explained with reference to FIG. 1. In the figure, reference symbols 2A, 2B, 2C, 2D, $\overline{2A}$, $\overline{2B}$, $\overline{2C}$ and $\overline{2D}$ denote memory arrays each including a plurality of memory cells, 4A to 4H and $\overline{4A}$ to $\overline{4H}$ row lines each made of polysilicon, and 6A to 6Q and $\overline{6A}$ to $\overline{6Q}$ column lines each made of aluminium. Memory cells are provided at intersections of the column and row lines. However, like the memory device disclosed in the aforementioned U.S. Pat. No. 4,044,340, all of the intersections are not provided with the memory cell but only one of two intersections between a pair of column lines and one row line is provided with the memory cell. The row lines 4A to 4D, 4F to 4H, $\overline{4A}$ to $\overline{4D}$, and $\overline{4E}$ to $\overline{4H}$ are common to the memory arrays 2A and 2B, 2C and 2D, $\overline{2A}$ and $\overline{2B}$, and $\overline{2C}$ and $\overline{2D}$, respectively. A pre-amplifier (not shown) is provided between a pair of adjacent column lines which are connected to common data lines 18 and $\overline{18}$ or common data lines 19 and $\overline{19}$. An address buffer 10 is first applied with one half (a first external address signal) of an external address signal so that a latch circuit 12 takes in the corresponding half (a first internal address signal) of an internal address signal. The output of the latch circuit 12 is applied through an internal address signal line 20 to all of row decoders 16A, 16B, $\overline{16A}$ and $\overline{16B}$ and column decoders 14A to 14D. Each of the row decoders 16A, 16B, $\overline{16A}$ and $\overline{16B}$ is provided between a pair of memory arrays which are adjacent to each other in the direction of row lines, and each of the column decoders 14A to 14D is provided between a pair of memory arrays which are adjacent to each other in the direction of column lines. The internal address signal line 20 includes a first signal line part 20A extending parallel to the row lines, and second signal line parts 20B and 20C connected to points on the first signal line part 20A and extending parallel to the column lines. The first signal line part 20A is disposed above the column decoders 14A to 14D and is connected to each column decoder at points thereabove. The connecting points are not shown. The second signal line parts 20B and 20C are connected to the row decoders 16A, $\overline{16A}$ and 16B, $\overline{16B}$ through switching MOSTs Qc (see FIG. 2). The second signal line part 20B is connected to the second signal line part 20A at a position which is farther than the connecting point of the column decoder 14B and first signal line part 20A and nearer than the connecting point of the column decoder 14A and first signal line part 20A with respect to the address buffer 12. That is, the second signal line part 20B is connected to the first signal line part 20A at a position between the above two connecting points. Similarly, the second signal line part 20C is connected to the first signal line part 20A at a position which is farther from the address buffer 12 than the connecting point of the column decoder 14D and the first signal line part 20A and nearer than the connecting point of the column decoder 14C and first signal line part 20A with respect to the address buffer 12.

Figure 2:
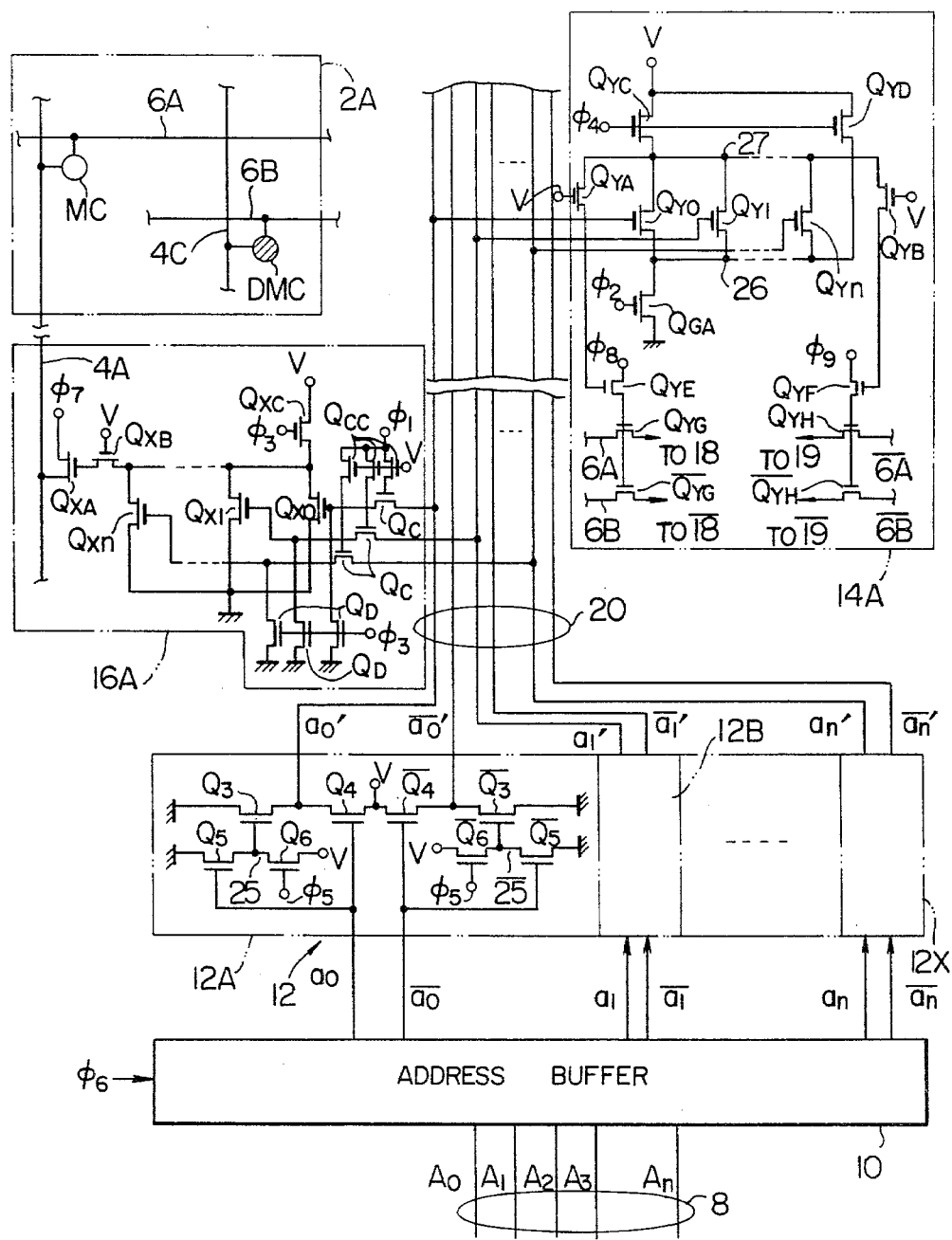
FIG. 2 is a detailed circuit diagram showing a main part of the embodiment shown in FIG. 1.

FIG. 2 shows a detailed circuit arrangement of that part of the embodiment shown in FIG. 1 which includes the address latch circuit 12, a portion of the row decoder 16A related to the row line 4A, and a portion of the column decoder 14A related to the column lines 6A and 6B. The remaining row and column decoders have the same circuit construction as the row and column decoders 16A and 14A, respectively. Transistors used in this embodiment are all n-type MOSTs. FIG. 3 shows a time chart of control signals used in the circuit shown in FIG. 2. Referring to FIGS. 2 and 3, the first external address signal made up of signals $A_o$ to $A_n$ is applied to the address buffer 10 through a line 8. At a time $T_1$, a clock signal $\phi_6$ assuming the high level is applied to the address buffer 10 which in turn delivers the first internal address signal which is made up of (n+1) signal pairs $(a_o, \overline{a_o})$, $(a_l, \overline{a_l})$, .... and $(a_n, \overline{a_n})$. The signals $a_o, a_l, \ldots, a_n$ are opposite in level (high or low) to the signals $\overline{a_o}, \overline{a_l}, \ldots, \overline{a_n}$. At that time, a pre-charging signal $\phi_5$ having been applied to the latch circuit 12 has been changed from the high level to the low level. Since the signal $\phi_5$ has been kept in the high level before this time, a node 25 in the latch circuit part 12A has been pre-charged to a high potential (or V volt) through an MOST $Q_6$. The signal $a_o$ is applied to the gate of an MOST $Q_5$. When the signal $a_o$ is in the high level, the MOST $Q_5$ assumes the on-state and therefore the potential of the node 25 is changed to the low level. As a result, an MOST $Q_3$ is turned off. Since the signal $a_o$ assuming the high level is also applied to the gate of an MOST $Q_4$, an internal address signal $a_o'$ assuming the high level is delivered from the source of the MOST $Q_4$ to the line 20. On the other hand, when the signal $a_o$ is in the low level, the MOSTs $Q_4$ and $Q_5$ are both in the off-state and therefore the potential of the node 25 is maintained at the high level. As a result, the internal address signal $a_o'$ is put in the low level. Thus, the signal $a_o'$ takes the high or low level in accordance with the high or low level of the signal $a_o$. The remaining MOSTs $\overline{Q_3}, \overline{Q_4}, \overline{Q_5}$ and $\overline{Q_6}$ in the latch circuit part 12A perform the same operation as the MOSTs $Q_3, Q_4, Q_5$ and $Q_6$ to convert a signal $\overline{a_o}$ into a corresponding signal $\overline{a_o'}$. Similarly, the latch circuit 12 delivers signals $a_l', \overline{a_l'}, \ldots, a_n'$ and $\overline{a_n'}$ corresponding to the signals $a_l, \overline{a_l}, \ldots, a_n$ and $\overline{a_n}$. The latch circuit 12 is provided for the reasons mentioned later. The signals $a_l', a_l', \ldots, a_n'$ and $a_n'$ on the line 20 are all kept in the low level before the time $T_1$. The internal address signal line 20 is made of aluminium.

Now, the operation of the row decoder 16A will be explained below by way of example. Before the time $T_1$, since a pre-charging signal $\phi_3$ is kept in the high level, the gate of an MOST $Q_{XA}$ is pre-charged to a high potential through MOSTs $Q_{XB}$ and $Q_{XC}$ so that the MOST $Q_{XA}$ is placed in the on-state. The signals on the line 20 kept in the low level are applied to the respective gates of MOSTs $Q_{XO}, Q_{Xl}, \ldots$ and $Q_{Xn}$ and therefore these MOSTs are put in the off-state. The sources of the MOSTs $Q_{XO}$ to $Q_{Xn}$ are common-connected, and the drains thereof are also common-connected. The MOST $Q_{XB}$ is always kept in the on-state. Since a signal $\phi_7$ applied to the drain of the MOST $Q_{XA}$ is kept in the low level, the row line 4A is placed in the low level. At the time $T_1$, the signal $\phi_3$ is changed to the low level and therefore the MOST $Q_{XC}$ assumes the off-state. The latch circuit 12 delivers the signals $a_o', \overline{a_o'}, \ldots, a_n'$ and $\overline{a_n'}$, one half of which assume the high level and the remaining signals assume the low level. The signals $a_o', a_l', \ldots a_n'$ are applied through MOSTs $Q_C$ to the MOSTs $Q_{XO}$ to $Q_{Xn}$ respectively. When all of these signals $a_o'$ to $a_n'$ take the low level, the MOSTs $Q_{XO}$ to $Q_{Xn}$ are all kept in the off-state and the gate of the MOST $Q_{XA}$ is maintained at the high potential. At a time $T_2$, the level of the signal $\phi_7$ becomes high so that a signal of high level is delivered to the row line 4A. That is, the row line 4A is selected. When at least one of the signals $a_o'$ to $a_n'$ takes the high level, at least one of the MOSTs $Q_{XO}$ to $Q_{Xn}$ is turned on so that the gate of the MOST $Q_{XA}$ is discharged to a low potential. Accordingly, the row line 4A is kept in the low level. Thus, the row line 4A is selected or not selected depending upon the levels of the signals $a_o'$ to $a_n'$. When the row line 4A takes the selected state, a signal stored in a memory cell MC is read out on the data line (or column line) 6A. Another row line 4C can be selected in a similar manner so that the contents of a dummy cell DMC are read out on the data line (or row line) 6B which is adjacent to the data line 6A. The signals read out on the data lines 6A and 6B are amplified in a differential fashion by a pre-amplifier (not shown). At a time $T_3$, the signal $\phi_1$ is put in the low level so that each MOST $Q_C$ is turned off to isolate the row decoder 16 from the line 20. As a result, the first internal address signal having been supplied through each MOST $Q_C$ is stored on the gate of each of the MOSTs $Q_{XO}$ to $Q_{Xn}$ and the row decoder 16A performs a decoding operation on the basis of the stored address signal. Thus, the potential of the row line 4A is maintained unchanged.

During the above operation period of the row decoder 16A from $T_1$ to $T_4$, the column decoder 14A is disabled or placed in the non-operative state. In more detail, since a signal $\phi_2$ applied to the gate of an MOST $Q_{GA}$ is kept in the low level, the MOST $Q_{GA}$ assumes the off-state. Accordingly, MOSTs $Q_{YO}$ to $Q_{Yn}$ having common-connected sources and common-connected drains are always placed in the off-state irrespective of the levels of the signals $a_o'$ to $a_n'$ which are applied to the gates of the MOSTs $Q_{YO}$ to $Q_{Yn}$. Thus, the MOST $Q_{GA}$ controls the disabling state of the column decoder 14A in cooperation with an MOST $Q_{YD}$ for pre-charge. On the other hand, since a signal $\phi_4$ is placed in the high level before the time $T_2$, the gates of MOST's $Q_{YE}$ and $Q_{YF}$ are pre-charged to the high potential (or V volt) through MOSTs $Q_{YC}$, $A_{YA}$ and $Q_{YB}$. In this period, since signals $\phi_8$ and $\phi_9$ applied respectively to the drains of the MOSTs $Q_{YE}$ and $Q_{YF}$ assume the low level, the column lines 6A, $\overline{6A}$, 6B and $\overline{6B}$ are isolated from the common data lines 18, $\overline{18}$, 19 and $\overline{19}$ respectively. At the time $T_2$ when each row decoder, for example, the row decoder 16A has completed its operation, the signal $\phi_4$ is charged to the low level so that the MOSTs $Q_{YC}$ and $Q_{YD}$ are turned off.

Then, at a time $T_5$, the signal $\phi_2$ is changed to the high level so that the MOST $Q_{GA}$ is turned on to discharge the node 26 to ground potential. Thus, the column decoder 14A is ready to operate or ready for its enabling state.

The signals $\phi_5$ and $\phi_6$ are put in the high and low levels respectively after the time $T_4$ and are restored to the low and high levels respectively at a time $T_6$.

A second external address signal is applied through the line 8 to the address buffer 10 at a period from times $T_4$ to $T_6$, and the address buffer 10 delivers at the time $T_6$ a second internal address signal corresponding to the second external address signal. Successively, the second internal address signal is delivered from the latch circuit 12 to the line 20. In the column decoder 14A, the signals $a_0'$, $a_l'$, and $a_n'$ on the line 20 are applied respectively to the gates of the MOSTs $Q_{Y1}$, $Q_{Y2}$, ... and $Q_{Yn}$. When all of these signals take the low level, the gates of the MOSTs $Q_{YE}$ and $Q_{YF}$ are placed in the high level.

Next, the signal $\phi_8$ is changed to the high level at a time $T_7$. Accordingly, MOSTs $Q_{YG}$ and $\overline{Q_{YG}}$ are turned on so that the data lines 6A and 6B are connected respectively to the common data lines 18 and $\overline{18}$. At this time, the signal $\phi_9$ assumes the low level. Therefore, MOSTs $Q_{YH}$ and $\overline{Q_{YH}}$ are placed in the off-state, and the data lines $\overline{6A}$ and $\overline{6B}$ are still isolated from the common data lines 19 and $\overline{19}$. On the other hand, in the case where the signal $\phi_8$ takes the low state and the signal $\phi_9$ takes the high state, the data lines $\overline{6A}$ and $\overline{6B}$ are connected to the common data lines 19 and $\overline{19}$ respectively. That is, either one of the signal $\phi_8$ or $\phi_9$ takes the high level in accordance with which memory array 2A or 2A is read out.

In the case where at least one of the signals $a_0'$, $a_l'$, ... and $a_n'$ takes the high level, the gates of the MOSTs $Q_{YE}$ and $Q_{YF}$ are discharged. Accordingly, these MOST's are turned off so that the data lines 6A, 6B, $\overline{6A}$ and $\overline{6B}$ are still isolated from the common data lines. That is, the decoder 14A is in a non-selected state. Thus, the operation of the decoder 14A is completed at the time $T_7$.

Next, the address buffer 10 and the latch circuit 12 are reset at a time $T_8$, and the column and row decoders are reset at a time $T_9$. Accordingly, the circuit shown in FIG. 2 is restored to its original state corresponding to the state at the time $T_1$. In the resetting operation at the time $T_9$, MOSTs $Q_D$ rapidly discharge the high-level signals which have been supplied from the line 20 to the gate electrodes of the MOSTs $Q_{Xl}$ to $Q_{Xn}$, to the ground potential in response to the signal $\phi_3$ assuming the high level at the time $T_9$.

Now, explanation will be made on the role of the latch circuit 12. When the column decoder 14A is operated or enabled, the MOST $Q_{GA}$ is turned on so that the node 26 is discharged from the high level to the low level. Further, when the decoder 14A takes the non-selected state, the node 27 is discharged from the high level to the low level. These changes in potential are capacitively coupled with the internal address signal on the line 20 through the overlap capacitances between the gate and source and between the gate and drain of each of the MOSTs $Q_{Y0}$ to $Q_{Yn}$ and through the floating capacitance between the nodes 26, 27 and the signal lines 20. As a result, an undershoot is generated in the internal address signal on the line 20 assuming the low level. Owing to this undershoot, the MOST $Q_C$ having been kept in the off-state is turned on. The high-level internal address signal stored in the gates of MOSTs $Q_{X0}$ to $Q_{Xn}$ of the row decoder 16A is discharged to the lower level due to the turn-on of the MOST $Q_C$. This change in potential of the gates of MOSTs $Q_{X0}$ to $Q_{Xn}$ lowers the gate voltage of the MOST $Q_{XA}$ through capacitive coupling between the gates and drains of the MOSTs $Q_{X0}$ to $Q_{Xn}$, so that the MOST $Q_{XA}$ is turned off. As a result, the row line 4A is placed in the floating state. However, in the circuit arrangement that the latch circuit 12 is provided at the output side of the address buffer 10, the above-mentioned undershoot is prevented by the action of the MOSTs $Q_3$ and $\overline{Q_3}$ so that the above-mentioned problem can be eliminated.

In the operation of the circuit shown in FIG. 2, the load capacitance of the latch circuit 12 is small so that the latch circuit 12 can drive the signal line 20 at high speed. More specifically, when the row decoder 16A is enabled, the source and drain of each of the MOSTs $Q_{Y0}$ to $Q_{Yn}$ are pre-charged at the same voltage. Accordingly, the gate capacitance of each of these MOSTs is substantially equal to zero. Further, since the signal line 20 is made of aluminium, the load capacitance due to the signal line 20 can be made small. Accordingly, when the row decoder 16A is enabled, the load capacitance of the latch circuit 12 is slightly affected by the column decoder 14A and signal line 20. Further, when the column decoder 14A is enabled, the row decoder 16A is isolated from the signal line 20 by means of the MOSTs $Q_C$. Accordingly, the load capacitance of the latch circuit 12 is not affected by the gate capacitance of each of the MOSTs $Q_{X0}$ to $Q_{Xn}$ which are included in the row decoder 16A.

According to the present invention, a memory device can be provided which can perform the memory-cell selecting operation at high speed even in the case where the row line, column line and common signal line 20 are made respectively of polysilicon, aluminuim and aluminium, and the row line is greater in resistance per unit length than the column line and signal line. Further, since memory cells in a large number of memory arrays are selected by the use of a common signal line, a memory device having high integration degree can be provided.

What is claimed is:

1. A memory device including a plurality of column lines, a plurality of row lines intersecting said column lines, a plurality of memory cells provided respectively at the intersections of said column lines and said row lines, row decoding means responsive to a first address signal for selecting at least one of said row lines, column decoding means responsive to a second address signal for selecting at least one of said column lines, address signal generator means for generating said first address signal and thereafter said second address signal, and common signal line means for supplying the output of said address signal generator means to said column decoder means and said row decoder means, wherein said row decoding means include switching means for connecting said common signal line means to said row decoding means to allow the application of said first address signal to said row decoding means and to inhibit the application of said second address signal to said row decoding means, and said column decoding means includes means for disabling said column decoding means during a period when said first address signal is applied to said column decoding means through said common signal line means.

2. A memory device according to claim 1, wherein said row decoding means include means for storing said first address signal supplied from said switching means to decode said first address signal.

3. A memory device according to claim 2, wherein said row decoding means include a plurality of first field effect transistors having common-connected sources and common-connected drains, and said switching means include a plurality of second field effect transistors for connecting the respective gates of said first field effect transistors to said common signal line means to store said first address signal from said common signal line means at said gates of said first field effect transistors.

4. A memory device according to claim 1, wherein said common signal line means is made up of a plurality of first signal lines arranged parallel to said row lines and a plurality of second signal lines arranged parallel to said column lines, said first signal lines being connected to said column decoding means, said second signal lines being connected to said first signal lines, and said row decoding means being connected to said second signal lines through said switching means.

5. A memory device according to claim 4, wherein said second signal lines are connected to said first signal lines at points farther than the connecting points of said first signal lines and said column decoding means with respect to said address signal generator means.

6. A memory device according to claim 4, wherein said second signal lines are connected to said first signal lines at points nearer than the connecting points of said first signal lines and said column decoding means with respect to said address signal generator means.

7. A memory device according to claim 4, wherein said second signal lines include a plurality of third signal line parts connected to said first signal lines at points farther than the connecting points of said first signal lines and said column decoding means with respect to said address signal generator means and a plurality of fourth signal line parts connected to said first signal lines at points nearer than the connecting points of said first signal lines and said column decoding means with respect to said address signal generator means, and said row decoding means includes first and second row decoder means connected respectively to said third and fourth signal line parts.

8. A memory device according to claim 7, wherein said column lines include a plurality of first column lines and a plurality of second column lines, said row lines include a plurality of first row lines intersecting said first column lines and a plurality of second row lines intersecting said second column lines, said first and second row decoder means are connected respectively to said first and second row lines to select at least one of said first row lines and at least one of said second row lines respectively, and said column decoding means include first column decoder means connected to said first column lines for selecting at least one of said first column lines and second column decoding means connected to said second column lines for selecting at least one of said second column lines.

9. A memory device according to claim 4, wherein said row decoding means are arranged so that said memory cells are divided into first and second memory cell arrays separated from each other in the direction of said row lines, said column decoding means includes first column decoder means for selecting the column lines connected to the memory cells in said first memory cell array and second column decoder means for selecting the column lines connected to the memory cells in said second memory cell array, and said second signal lines are connected to said first signal lines at positions between the connecting points of said first column decoder means and said first signal lines and the connecting points of said second column decoder means and said first signal lines.

10. A memory device according to any one of the preceding claims, wherein said column decoding means comprise a plurality of field effect transistors having sources common-connected, drains common-connected and gates connected to said common signal line, means for pre-charging said common-connected sources and drains to a predetermined voltage, and switching means connected to said common-connected sources for discharging said common-connected sources after said first address signal has been applied to said common signal line means.

11. A memory device according to claim 10, wherein each of said row lines is higher in resistance per unit length than said common signal line.

12. A memory device according to claim 11, wherein each of said row lines is higher in resistance per unit length than any one of said column lines.

13. A memory device according to claim 11, wherein said row lines are made of polysilicon.

14. A memory device according to claim 13, wherein said common signal line means is made of aluminium.

15. A memory device according to claim 12, wherein said row lines are made of polysilicon.

16. A memory device according to claim 15, wherein said column lines are made of aluminium.

17. A memory device according to claim 1, wherein said address signal generator means comprises address buffer means for preventing the lowering of said address signals having low levels.

18. A decoder comprising:
a plurality of field effect transistors having gates applied with an address signal, sources common-connected and drains common-connected;
means connected to said common-connected sources and said common-connected drains for pre-charging said sources and drains to a predetermined voltage; and
switching means connected to said common-connected sources for discharging said common-connected sources.

19. A memory device comprising:
a plurality of column lines;
a plurality of row lines intersecting said column lines;
a plurality of memory cells provided respectively at the intersections of said column lines and said row lines;
row decoding means responsive to a first address signal for selecting at least one of said row lines;
column decoding means responsive to a second address signal for selecting at least one of said column lines;

address signal generator means for generating said first address signal and thereafter said second address signal;

common signal line means for supplying the output of said address signal generator means to said column decoding means and said row decoding means, said common signal line means being made up of a plurality of first signal lines arranged parallel to said row lines and a plurality of second signal lines arranged parallel to said column lines and connected to said first signal lines, said column and row decoding means being connected respectively to said first and second signal lines;

means for rendering the row decoding means non-responsive to the second address signal; and means for rendering the column decoding means non-responsive to the first address signal.

20. A memory device according to claim 19, wherein said second signal lines are connected to said first signal lines at points farther than the connecting points of said first signal lines and said column decoding means with respect to said address signal generator means.

21. A memory device according to claim 19, wherein said second signal lines are connected to said first signal lines at points nearer than the connecting points of said first signal lines and said column decoding means with respect to said address signal generator means.

22. A memory device according to claim 19, wherein said second signal lines include a plurality of third signal line parts connected to said first signal lines at points farther than the connecting points of said first signal lines and said column decoding means with respect to said address signal generator means and a plurality of fourth signal line parts connected to said first signal lines at points nearer than the connecting points of said first signal lines and said column decoding means with respect to said address signal generator means, and said row decoding means includes first and second row decoder means connected respectively to said third and fourth signal line parts.

23. A memory device according to claim 22, wherein said column lines include a plurality of first column lines and a plurality of second column lines, said row lines include a plurality of first row lines intersecting said first column lines and a plurality of second row lines intersecting said second column lines, wherein said first and second row decoder means are connected respectively to said first and second row lines and select at least one of said first row lines and at least one of said second row lines respectively, and said column decoding means include first column decoder means connected to said first column lines for selecting at least one of said first column lines and second column decoder means connected to said second column lines for selecting at least one of said second column lines.

24. A memory device according to claim 19, wherein said row decoding means are arranged so that said memory cells are divided into first and second memory cell arrays separated from each other in the direction of said row lines, said column decoding means includes first column decoder means for selecting the column lines connected to the memory cells in said first memory cell array and second column decoder means for selecting the column lines connected to the memory cells in said second memory cell array, and said second signal lines are connected to said first signal lines at positions between the connecting points of said first column decoder means and said first signal lines and the connecting points of said second column decoder means and said first signal lines.

25. A memory device according to claim 19, wherein said address signal generator means comprises address buffer means for preventing the lowering of said address signals having low levels.

26. A memory device according to claim 1, further comprising a latch circuit coupled between said address signal generator means and said common signal line means, said latch circuit providing first and second latched output signals having levels corresponding to the levels of said first and second address signals, respectively.

27. A memory device including a plurality of column lines, a plurality of row lines intersecting said column lines, a plurality of memory cells provided respectively at the intersections of said column lines and said row lines, row decoding means responsive to a first address signal for selecting at least one of said row lines, column decoding means responsive to a second address signal for selecting at least one of said column lines, address signal generator means for generating said first address signal and thereafter said second address signal, and common signal line means for supplying the output of said address signal generator means to said column decoder means and said row decoder means, wherein said row decoding means include switching means for connecting said common signal line means to said row decoding means to allow the application of said first address signal to said row decoding means and to inhibit the application of said second address signal to said row decoding means, and said column decoding means includes means for disabling said column decoding means during a period when said first address signal is applied to said column decoding means through said common signal line means so that the effect of a load capacitance of the row decoding means on the address signal generator is reduced during the second address signal period and the effect of a load capacitance of the column decoding means on the address signal generator is reduced during the first address signal period.

* * * * *